United States Patent
Ring et al.

(10) Patent No.: US 6,992,311 B1
(45) Date of Patent: Jan. 31, 2006

(54) IN-SITU CLEANING OF BEAM DEFINING APERTURES IN AN ION IMPLANTER

(75) Inventors: Philip J. Ring, Beverly, MA (US); Alexander S. Perel, Danvers, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 11/037,491

(22) Filed: Jan. 18, 2005

(51) Int. Cl.
*H01J 37/317* (2006.01)
*H01J 37/36* (2006.01)

(52) U.S. Cl. .............................. 250/492.21; 250/492.2; 250/492.3; 250/423 R; 250/424

(58) Field of Classification Search ..................... None
See application file for complete search history.

(56) References Cited

U.S. PATENT DOCUMENTS

| | | | | |
|---|---|---|---|---|
| 5,554,854 | A | * | 9/1996 | Blake ..................... 250/492.21 |
| 5,633,506 | A | * | 5/1997 | Blake ..................... 250/492.21 |
| 6,221,169 | B1 | * | 4/2001 | Bernstein et al. ............... 134/2 |
| 6,313,905 | B1 | | 11/2001 | Brugger et al. |
| 6,559,462 | B1 | | 5/2003 | Carpenter et al. |
| 6,573,517 | B1 | | 6/2003 | Sugitani et al. |
| 2003/0042427 | A1 | * | 3/2003 | Sullivan et al. ............. 250/397 |

\* cited by examiner

*Primary Examiner*—Nikita Wells
(74) *Attorney, Agent, or Firm*—Eschweiler & Associates, LLC

(57) ABSTRACT

A method for cleaning an ion implantation, comprising providing an ion implantation system, wherein the ion implantation system comprises one or more components having one or more contaminants disposed thereon. A process species is provided to the ion implantation system, wherein the process species is otherwise utilized to implant ions into a workpiece. Ions are formed from the process species, therein defining an ion source. An ion beam is then extracted from the ion source via an application of an extraction voltage to an ion extraction assembly associated with the ion source. The extraction voltage is further modulated, wherein a trajectory of the ion beam is oscillated within a predetermined range. The ion beam is consequently swept across the one or more components, thus substantially removing the one or more contaminants therefrom.

19 Claims, 6 Drawing Sheets

IN-SITU CLEANING OF BEAM DEFINING APERTURES IN AN ION IMPLANTER

FIELD OF THE INVENTION

The present invention relates generally to ion implantation systems, and more specifically to systems and methods for cleaning one or more beam defining devices in an ion implantation system.

BACKGROUND OF THE INVENTION

In the manufacture of semiconductor devices and other products, ion implantation systems are used to impart impurities, known as dopant elements, into semiconductor wafers, display panels, or other workpieces. Typical ion implantation systems or ion implanters treat a workpiece with an ion beam in order to produce n- or p-type doped regions, or to form passivation layers in the workpiece. When used for doping semiconductors, the ion implantation system injects a selected ion species to produce the desired extrinsic material. For example, implanting ions generated from source materials such as antimony, arsenic, or phosphorus results in n-type extrinsic material wafers. Alternatively, implanting ions generated from materials such as boron, gallium, or indium creates p-type extrinsic material portions in a semiconductor wafer.

FIG. 1A illustrates an exemplary ion implantation system 10 having a terminal 12, a beamline assembly 14, and an end station 16. The terminal 12 includes an ion source 20 powered by a high voltage power supply 22 that produces and directs an ion beam 24 through the beamline assembly 14, and ultimately, to the end station 16. The beamline assembly 14 has a beamguide 26 and a mass analyzer 28, wherein a dipole magnetic field is established to pass only ions of appropriate charge-to-mass ratio through an aperture 30 at an exit end of the beamguide 26 to a workpiece 32 (e.g., a semiconductor wafer, display panel, etc.) in the end station 16.

During ion implantation into the workpiece 32, various contaminants (not shown) are typically generated over time, wherein ions from the ion beam 24 strike various components 34, such as the aperture 30, along the beam path. Such collisions of ions with the various components 34, or even the workpiece 32 itself, can sputter contaminants (not shown) onto various situated surfaces along the beam path. Typically, the components 34 residing along the ion beam path are generally comprised of graphite, wherein the sputtered contaminants (not shown) are generally comprised of carbon, and possibly even some of the species of the ion beam 24 itself.

FIGS. 1B and 1C illustrate a conventional aperture 30, wherein contaminants 36 have been sputtered onto surfaces 38 of the aperture. Over time, the contaminants 36 grow and build upon themselves, wherein a potential exists for portions of the contaminants (e.g., free contaminants 40) to eventually break free or flake off from the surfaces 38. Such free contaminants 40 may then travel with the ion beam 24, and be imparted onto the workpiece 30 of FIG. 1A. Such contamination of the workpiece 30 may lead to a failure of the resulting device(s) (not shown) formed on the workpiece, thus decreasing the efficiency and product yield of the ion implantation system 10.

A continuing trend toward smaller electronic devices has further presented an incentive to "pack" a greater number of smaller, more powerful and more energy efficient semiconductor devices onto individual wafers. This necessitates careful control over semiconductor fabrication processes, including ion implantation, and more particularly, necessitates a minimization of contaminants imparted onto the workpieces during ion implantation. Moreover, semiconductor devices are being fabricated upon larger and larger workpieces in order to increase product yield. For example, wafers having a diameter of 300 mm or more are being utilized so that more devices can be produced on a single wafer. Such wafers are expensive and, thus, make it very desirable to mitigate waste, such as having to scrap an entire wafer due to contaminants imparted to the wafer during ion implantation.

As a consequence, contamination formed on surfaces within the ion implanter 10 of FIG. 1A is conventionally removed by a manual cleaning of the various components 34 by an operator during scheduled maintenance of the ion implantation system. Such manual cleaning is costly, not only in terms of time and labor attributed to the operator, but also in terms of decreased efficiency and yield of the ion implantation system 10 due to increased down-time associated with the maintenance. As an alternative, reactive gases (not shown) have been introduced into the ion implantation system 10 in an attempt to remove the contamination by chemical reaction between the contaminants and the reactive gases. This solution, however, typically requires a change of gases in the ion implanter 10, wherein the source material gas used for implanting ions into the workpiece 30 is purged from the ion implanter, the reactive gas is then used to remove the contamination, and then the reactive gas is further purged from the implanter prior to processing another workpiece. Such a change of gases, however, may decrease the efficiency of the ion implantation system 10, thus decreasing a throughput of the implanter.

Accordingly, a need currently exists for an improved ion implantation system cleaning method, wherein efficient contaminant removal can be facilitated, and wherein the cleaning method can be performed in-situ using the same source material gas used to implant ions into the workpiece, wherein high throughput and highly reliable ion implantation into a workpiece can be achieved.

SUMMARY OF THE INVENTION

The present invention overcomes the limitations of the prior art by providing a method for cleaning an ion implantation system in-situ, utilizing the same process species as used for implanting ions into a workpiece. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a method for in-situ cleaning of an ion implantation system using the same species for both cleaning one or more components in the ion implantation system, as well as for implanting ions into a workpiece. According to one exemplary aspect of the present invention, an ion implantation system is provided, wherein the ion implantation system comprises one or more components, such as a resolving plate, having one or more contaminants disposed thereon. A process species is provided to the ion implantation system for forming ions therefrom, wherein the ions formed from the process species generally define an ion source.

An ion beam is further extracted from the ion source by an application of an extraction voltage to an ion extraction assembly associated with the ion source. For example, the extraction assembly comprises one or more extraction electrodes, wherein the extraction voltage is provided to the one or more electrodes from an extraction voltage source controlled by a controller. The extraction voltage is then modulated, wherein a trajectory of the ion beam is oscillated within a predetermined range, thus sweeping the ion beam across the one or more components. The one or more contaminants residing on upstream facing surfaces of the one or more components are subsequently removed by the cyclically-sweeping ion beam.

According to another exemplary aspect of the invention, a barrier is placed in a path of the ion beam prior to the modulation of the extraction voltage, wherein the barrier is placed generally downstream from the one or more components. For example, the barrier comprises a flag Faraday positioned downstream from the resolving plate, or a Faraday cup positing within an end station of the ion implantation system. The barrier generally collects the one or more contaminants removed from the one or more components during the subsequent extraction voltage modulation, thus generally containing the contaminants and generally preventing the contaminants from contaminating other components of the ion implantation system.

In accordance with yet another exemplary aspect of the present invention, the one or more components comprise a resolving plate having an aperture therethough defining at least a first surface. An upstream facing surface of the resolving plate is further generally defined by a second surface obliquely oriented with respect to the ion beam, wherein at least some of the one or more contaminants are disposed on the second surface. Upon modulation of the extraction voltage, the ion beam is generally swept across at least the upstream facing surface of the aperture, therein rapidly thermally cycling one or more of the contaminants and the aperture, thus generally dislodging the one or more contaminants from the aperture. The dislodged contaminants, for example, are then collected by the barrier, thus limiting an amount of cross-contamination within the ion implantation system.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
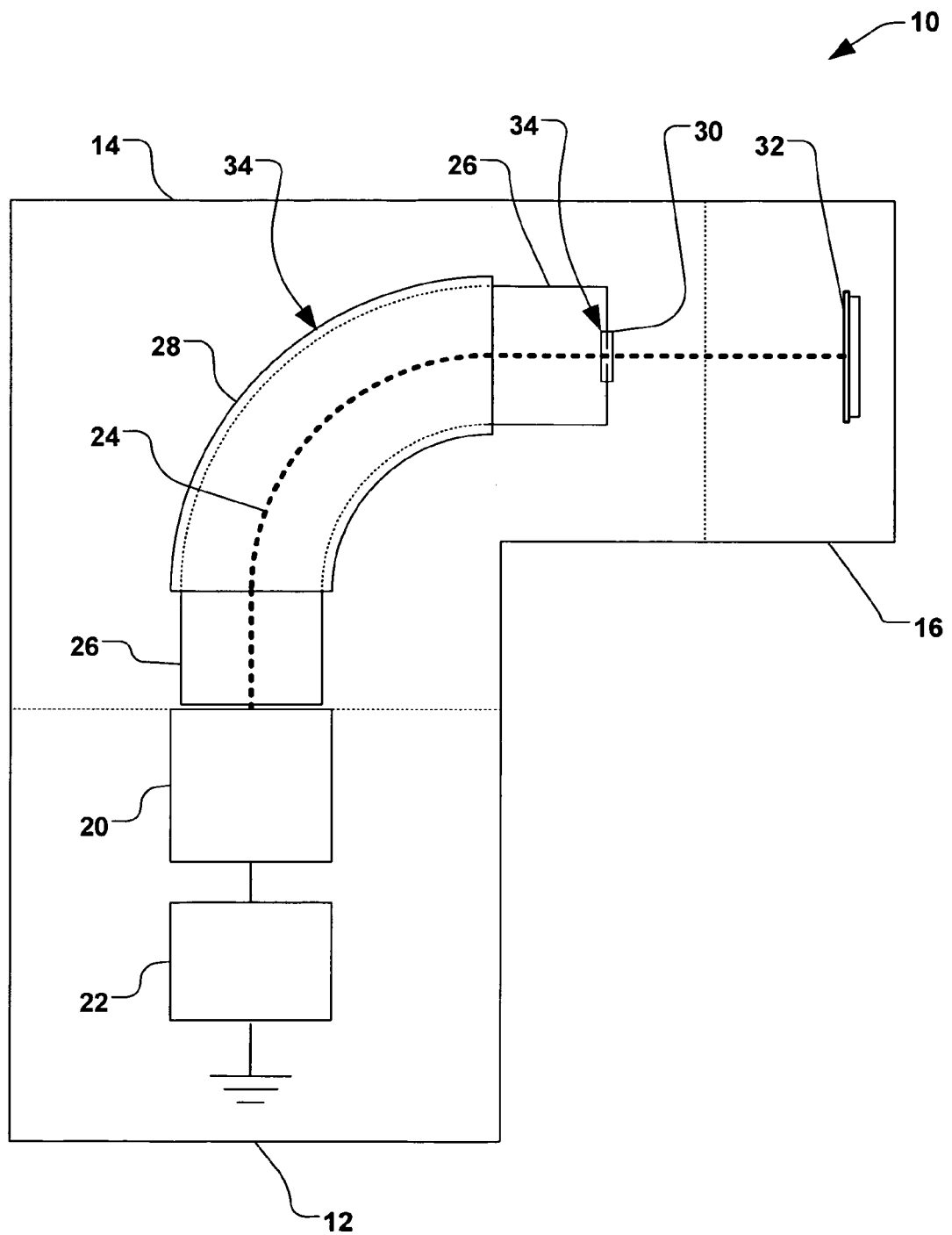
FIG. 1A is a plan view of a conventional ion implantation system.
Figure 1B:
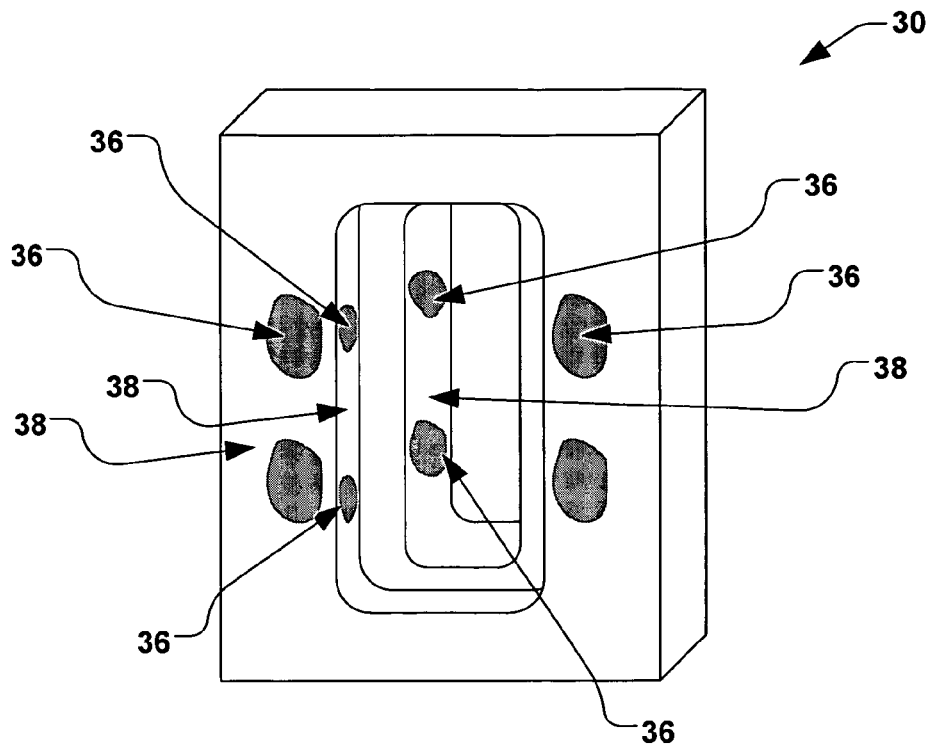
FIGS. 1B–1C are respective perspective and plan views of a conventional aperture having contamination formed thereon.
Figure 1C:
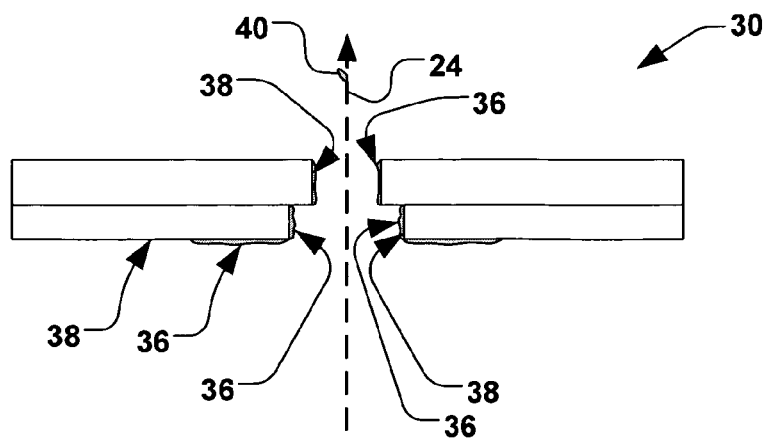

The present invention is directed generally towards a system and method for cleaning beam defining devices in an ion implantation system. More particularly, the method provides an in-situ cleaning of a beam defining aperture using an ion species that is also used for ion implantation into a workpiece. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
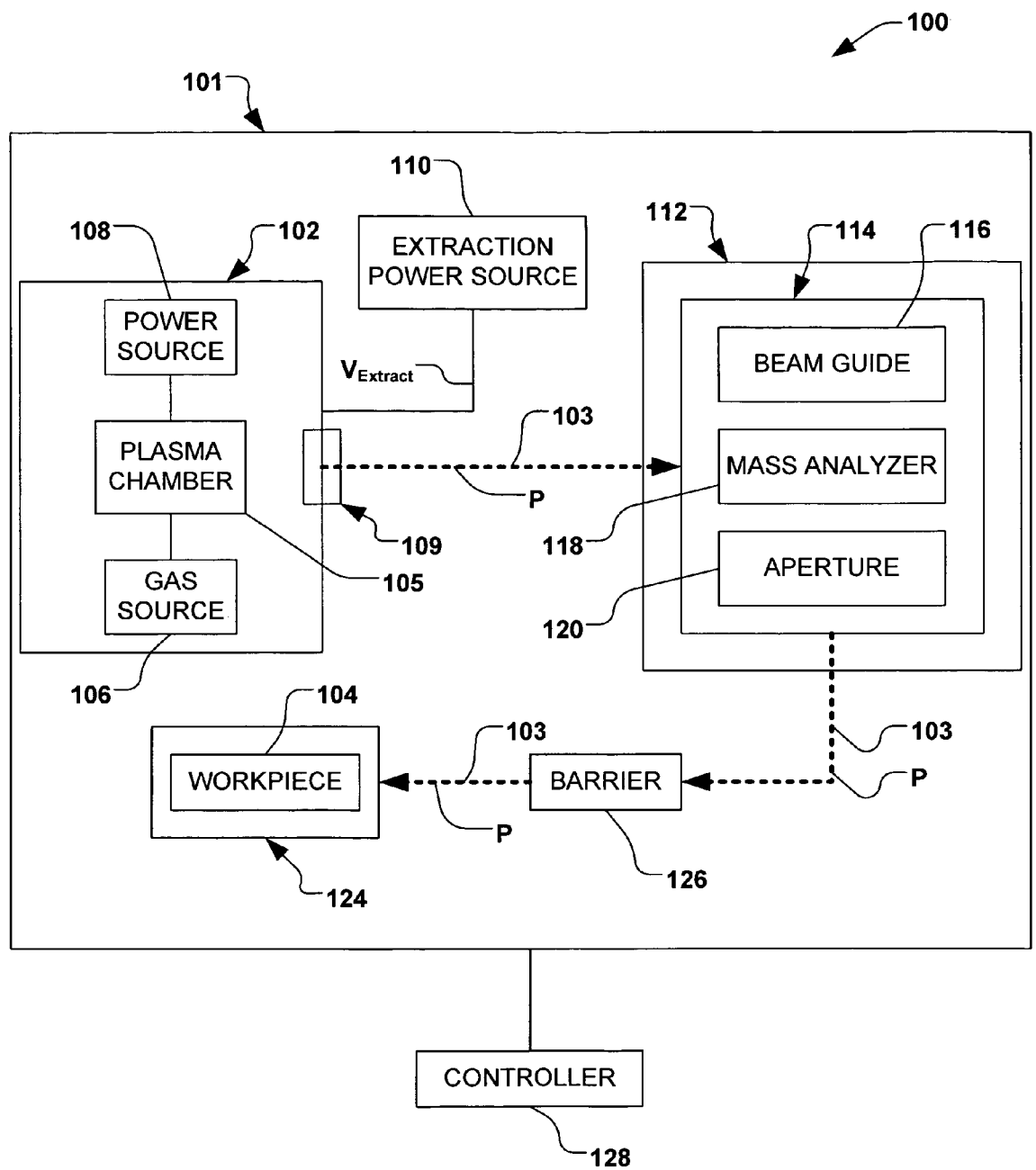
FIG. 2 is a system-level block diagram of an exemplary ion implantation system according to one aspect of the present invention.

Referring now to the figures, FIG. 2 illustrates an exemplary ion implantation system 100 depicted in block diagram form, wherein the exemplary ion implantation system is suitable for implementing one or more aspects of the present invention. The system 100 comprises an ion implantation apparatus 101 comprising an ion source 102 for producing a quantity of ions operable to travel along an ion beam path P, thus defining an ion beam 103 for implantation of the ions into a workpiece 104. The ion source 102 generally comprises a plasma chamber 105, a process gas source 106, and a power source 108, wherein positively charged ions are generated from the process gas within the plasma chamber by an application of power from the power source. The process gas source 106 may comprise a source material such as an ionizable gas or vaporized solid source material or species that has been previously vaporized. For an n-type implantation into the workpiece 104, for example, the source materials may comprise boron, gallium or indium. For a p-type implantation, for example, the source materials may comprise arsenic, phosphorus, or antimony.

The ion source 102 further comprises an extraction assembly 109 associated therewith, wherein charged ions are extracted from the ion source upon an application of an extraction voltage $V_{Extract}$ thereto. An extraction power source 110 is operable to provide the extraction voltage $V_{Extract}$, wherein the extraction voltage may be further modulated, as will be discussed infra. A beamline assembly 112 is further provided downstream of the ion source 102, wherein the beamline assembly generally receives the charged ions. The beamline assembly 112, for example, comprises one or more components 114, such as a beamguide 116, a mass analyzer 118, and an aperture 120, wherein the one or more components are operable to form and shape the ion beam 103.

The mass analyzer 118, for example, further comprises a field generating component, such as a magnet (not shown), wherein the mass analyzer generally provides a magnetic field across the ion beam 103, thus deflecting ions from the ion beam at varying trajectories according to a charge-to-mass ratio of the ions. For example, ions traveling through the magnetic field experience a force that directs individual ions of a desired charge to mass ratio along the beam path P and deflects ions of undesired charge to mass ratios away from the beam path. Once through the mass analyzer 118, the ion beam 103 is directed though the aperture 120, wherein the ion beam is generally limited to produce a concise beam for implantation into a workpiece 104 (e.g., a semiconductor wafer, display panel, etc.).

The ion implantation system 100 further comprises an end station 124, wherein the workpiece 104 generally resides. In the manufacture of integrated circuit devices, display panels, and other products, it is generally desirable to uniformly implant dopant species across the entire surface of the workpiece 104. The ion implantation device 101 can therefore be configured to implant ions into a single workpiece 104 (e.g., a "serial" ion implanter), wherein the workpiece generally resides on a pedestal or chuck (not shown) situated within the end station 124. Alternatively, the ion implantation device 101 can be configured to implant ions into multiple workpieces 104 (e.g., a "batch" ion implanter), wherein the end station 124 comprises a rotating platter (not shown), whereon several workpieces are translated with respect to the ion beam 103. It should be noted that any ion implantation device operable to extract ions from an ion source and implant them into one or more workpieces is contemplated as falling within the scope of the present invention.

The ion implantation device 101 further comprises a barrier 126 generally situated along the path P of the ion beam 103. In one example, the barrier generally resides between the beamline assembly 112 and the end station 124. The barrier 126, for example, is operable to selectively block the ion beam 103 from entering the end station 124. For example, the barrier 126 is operable to translate and/or rotate into and out of the ion beam path P, wherein the ion beam 103 is generally prevented from entering the end station 124 or impinging on the workpiece 104. Alternatively, the barrier 126 is situated within the end station 124, wherein the barrier generally resides along the ion beam path P at a position downstream of the workpiece 104. The barrier 126 may serve one or more purposes, such as to substantially block the ion beam 103 and/or to provide a measurement component for analyzing the ion beam.

The ion implantation system 100 further comprises a controller 128, wherein the controller is operable to control the ion implantation device 101. For example, the controller 128 is operable to control the power source 108 for producing the ions, as well as the extraction power source 110, wherein the ion beam path P is generally controlled. The controller 128 is further operable to adjust the strength and orientation of the magnetic field associated with the mass analyzer 118, among other things. In another example, the controller 128 is further operable to control the position of the barrier 126 with respect to the ion beam path P, as well as a position of the workpiece 104 within the ion implantation apparatus 101. It will be appreciated that the controller 128 may comprise a processor and/or computer system for overall control of the system 100 (e.g., in conjunction with input by an operator).

Figure 3:
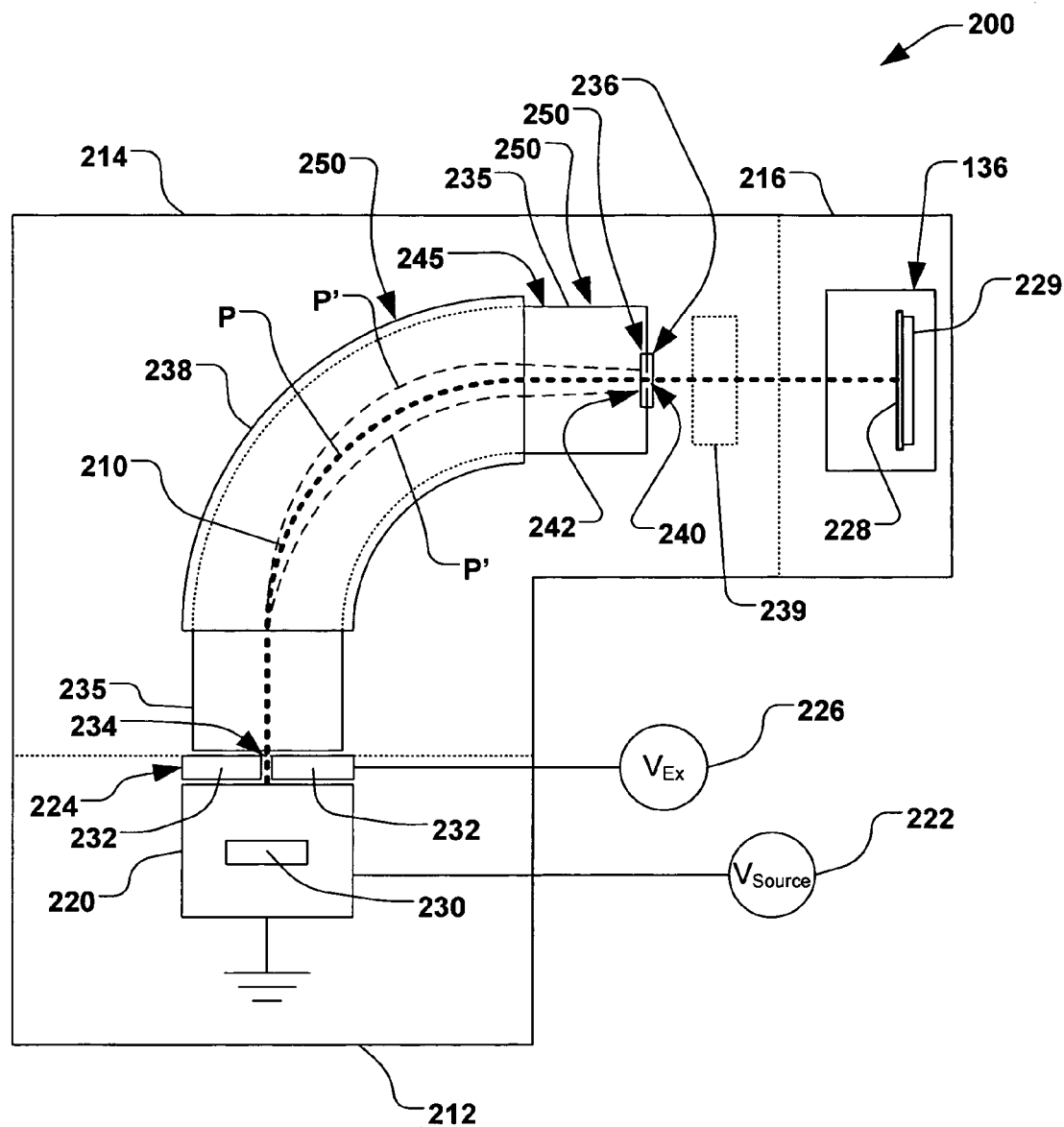
FIG. 3 is a plan view of an exemplary ion implantation apparatus according to another aspect of the present invention.

Referring now to FIG. 3, an exemplary ion implantation apparatus 200 is illustrated, such as the apparatus 101 in FIG. 2, wherein the exemplary ion implantation apparatus is shown in greater detail. It should be again noted that although the ion implantation apparatus 200 is illustrated as one example, the present invention can be practiced using various other types of ion implantation apparatus and systems, such as high energy systems, low energy systems, or other implantation systems, and all such systems are contemplated as falling within the scope of the present invention.

The ion implantation system 200, for example, comprises a terminal 212, a beamline assembly 214, and an end station 216, wherein the terminal comprises an ion source 220 powered by a source power supply 222. The terminal 212 further comprises an extraction assembly 224 powered by an extraction power supply 226 to extract ions from the ion source 220 and thereby to provide the extracted ion beam 210 to the beamline assembly 214. The extraction assembly 224, in conjunction with the beamline assembly 214, for example, are operable to direct the ions toward a workpiece 228 residing on a support 229 in the end station 216 for implantation thereof at a given energy level.

In one example, the ion source 220 comprises a plasma chamber (not shown) wherein ions of a process gas or species are energized at a high positive potential $V_{source}$. It should be noted that generally, positive ions are generated, although the present invention is also applicable to systems wherein negative ions are generated by the source 220. The extraction assembly 224 further comprises a plasma electrode 230 and one or more extraction electrodes 232, wherein the plasma electrode is biased with respect to the one or more extraction electrodes, but floats with respect to the plasma within the ion source 220 (e.g., the plasma electrode at 120 kV with respect to the workpiece 228, wherein the workpiece is typically grounded). The one or more extraction electrodes 232, for example, are biased at a voltage less than that of the plasma electrode 230 (e.g., an extraction voltage $V_{Extract}$ of 0–100 kV). The negative relative potential at the one or more extraction electrodes 232 with respect to the plasma creates an electrostatic field operable to extract and accelerate the positive ions out of the ion source 220. For example, the one or more extraction electrodes 232 have one or more extraction apertures 234 associated therewith, wherein positively charged ions exit the ion source 220 through the one or more extraction apertures to form the ion beam 210, and wherein a velocity of the extracted ions is generally determined by the potential $V_{Extract}$ provided to the one or more extraction electrodes.

The beamline assembly 214, according to one aspect of the invention, comprises a beamguide 235 having an entrance near the ion source 220 (e.g., associated with the extraction aperture 234) and an exit with a resolving plate 236, as well as a mass analyzer 238 that receives the extracted ion beam 210 and creates a dipole magnetic field to pass only ions of appropriate charge-to-mass ratio or range thereof (e.g., a mass analyzed ion beam having ions of a desired mass range) to the workpiece 228 positioned in the end station 216. The ionization of source materials in the ion source 220 generates a species of positively charged ions having a desired atomic mass. However, in addition to the desired species of ions, the ionization process will also generate a proportion of ions having other atomic masses as well. Ions having an atomic mass above or below the proper atomic mass are not suitable for implantation and are referred to as undesirable species. The magnetic field generated by the mass analyzer 238 generally causes the ions in the ion beam 210 to move in a curved trajectory, and accordingly, the magnetic field is established such that only ions having an atomic mass equal to the atomic mass of the desired ion species traverse the beam path P to the end station 216.

According to another exemplary aspect of the invention, the ion implantation apparatus 200 comprises barrier 239 pivotably coupled thereto, wherein the barrier is operable to be pivoted to selectively intersect the path P of the ion beam 210 in order to measure characteristics of the ion beam and/or substantially prevent the ion beam 210 from entering the end station 216. For example, the barrier comprises a flag Faraday that can be pivoted to intersect the beam path P, wherein the controller 128 of FIG. 2 is operable to determine whether characteristics of the ion beam are satisfactory for ion implantation. After the such a determination is made, the controller 128 is operable to translate the flag Faraday out of the beam path P so as to not interfere with ion implantation of the workpiece 124. Alternatively, the barrier 239 of FIG. 3 comprises a Faraday cup (not shown) associated with the end station 216, wherein the ion beam 210 is operable to strike the Faraday cup in the absence of the workpiece 228.

In accordance with still another aspect of the invention, the resolving plate 236 at the exit of the beamguide 235 of FIG. 3 operates in conjunction with the mass analyzer 238 to eliminate undesirable ion species from the ion beam 210 which have an atomic mass close to, but not identical, to the atomic mass of the desired species of ions. The resolving plate 236, for example, is further comprised of vitreous graphite or another material such as tungsten or tantalum, and includes one or more elongated apertures 240, wherein the ions in the ion beam 210 pass through the aperture as they exit the beamguide 235. At the resolving plate 236, a dispersion of ions from the path P of the ion beam 210 (e.g., illustrated at P') is at its minimum value, wherein a width of the ion beam (P'—P') is at a minimum where the ion beam 210 passes through the resolving aperture 240.

Figure 4A:
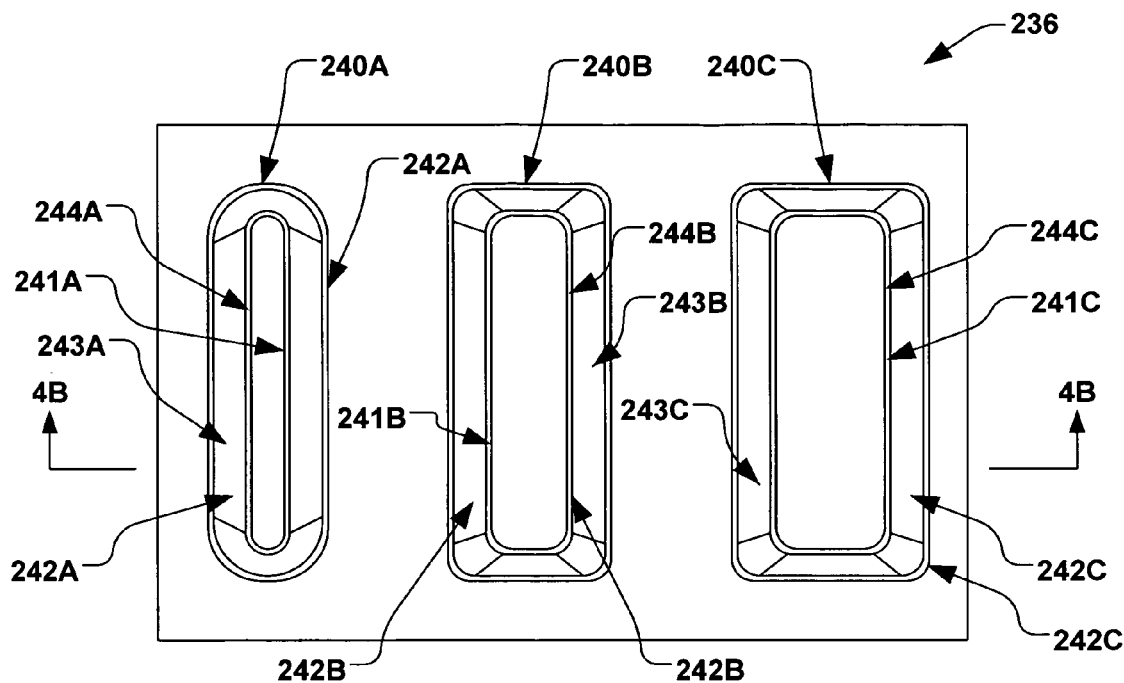
FIGS. 4A–4B illustrate plan and cross-sectional views of an exemplary resolving plate having a plurality of resolving apertures in accordance with yet another aspect of the present invention.
Figure 4B:
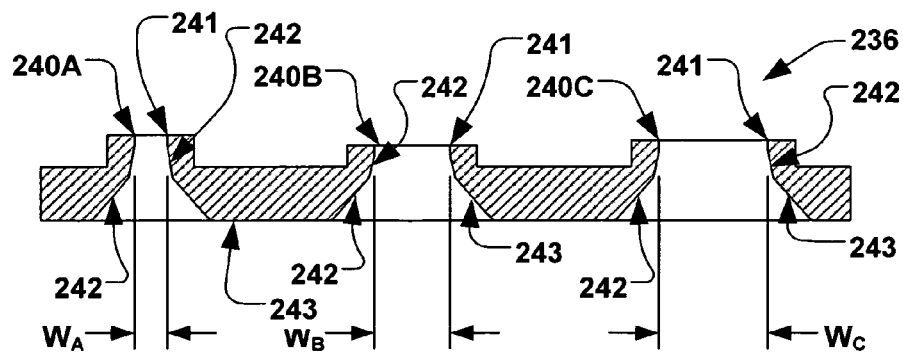

In accordance with one exemplary aspect of the present invention, an exemplary resolving plate 236 is illustrated in FIGS. 4A–4B, wherein the resolving plate comprises three resolving apertures 240A–240C having varying widths. Each resolving aperture 240A–240C, for example, is associated with a respective ion implantation recipe (e.g., a particular ion species), wherein the desired aperture width for a particular species of ion implantation can be selected by positioning the desired resolving aperture 240A–240C along the ion beam path P. According to one exemplary aspect of the invention, each resolving aperture 240A–240C is generally defined by a first surface 241 that is generally parallel with the ion beam path P. A width $W_A$–$W_C$ of each respective aperture 240A–240C between the respective first surfaces 241 is generally associated with the minimum value of the dispersion of the ion beam 210 of FIG. 3, as discussed above.

In another example, each resolving aperture 240A–240C is further defined by an upstream facing surface 242, wherein the upstream facing surface is operable to be impacted by the ion beam 210. For example, the upstream facing surface 242 is generally defined by a second surface 243 obliquely oriented with respect to the ion beam 210, wherein the second surface is generally beveled with respect to the first surface 241 and the ion beam. The second surface 243, therefore, generally defines a beveled upstream facing surface 242 of each resolving aperture 240A–240C. The upstream facing surface 242 of each resolving aperture 240A–240C may be still further defined by a third surface 244 obliquely oriented with respect to the first surface 241 and second surface 243, wherein the third surface is closer to being parallel with the first surface than the second surface. It should be noted that the upstream facing surface 242 of each resolving aperture 240 A–240C may have any number of surfaces, and that each respective aperture may have differing beveled angles or shapes. Furthermore, any of the upstream facing surfaces 242 may be rounded or otherwise shaped such that the respective upstream facing surface provides a larger surface area of the aperture 240 for the ion beam 210 to impact. Accordingly, all such beveled or otherwise shaped upstream facing surfaces 242 of the resolving aperture 240 are contemplated as falling within the scope of the present invention.

As explained above, the strength and orientation of the magnetic field of the mass analyzer 238 of FIG. 3, as well as the velocity of the ions extracted from the ion source 220, is established by the controller of FIG. 2, such that only ions having an atomic weight equal to the atomic weight (or charge-to-mass ratio) of the desired species will traverse the predetermined, desired ion beam path P to the end station 216. Undesirable species of ions having an atomic mass much larger or much smaller than the desired ion atomic mass are sharply deflected and impact a housing 245 of the beamguide 235 of FIG. 3.

However, if the atomic mass of an undesirable ion closely approximates the atomic mass of the desired species, the trajectory of the undesirable ion will be only slightly deflected from the desired beam path P. Accordingly, such an undesirable ion having only a slight deflection from the desired beam path P would have a tendency to impact the upstream facing surface 242 of the resolving plate 236. Over time, such undesirable species of ions which impact the resolving plate 236 will tend to build up on the resolving plate.

For example, for ion implantations utilizing boron ions to produce p-type extrinsic material on the workpiece 228, the typically-desired implantation species is an ion including boron-11 (i.e., ions having boron with a mass of eleven atomic mass units). However, experience has shown that ionizing source materials including vaporized boron in the ion source 220 also generates ions having another boron isotope, boron-10 (i.e., boron with a mass of ten atomic mass units), wherein ions including boron-10 are typically an undesirable species. Since the atomic mass of the two isotopes (boron-10 and boron-11) differ by only 10%, the trajectory of the undesirable ion species including the boron-10 isotope is close to the trajectory of the desired boron-11 ion beam path P. However, because of their difference in masses, the ions including boron-10 are slightly skewed from the desired beam line P, and consequently, impact the resolving plate 236. Therefore, the ions including the boron-10 isotope are generally prevented from reaching the end station 216 by the resolving plate 236, wherein the undesirable ions are further generally prevented from being implanted in the workpiece 228.

During operation of the ion implantation apparatus 200, contaminant materials such as undesirable species of ions, sputtered carbon from the resolving aperture 236, beamguide 235, etc., as well as dopant material from the ion source 220, will tend to build up on surfaces of implanter components 250 adjacent the ion beam 210. For example, the upstream facing surface 242 of the resolving plate 236 will have a tendency to build up contaminants (not shown) after repeated ion implantations into workpieces 228. In addition, photoresist material from the workpieces 228 themselves may also build up on the interior surfaces of the ion implantation apparatus 200.

Build up of contaminant materials on the components 250 such as the resolving plate 236 has a tendency to eventually flake off during implantation, thus creating disadvantageous electrical discharges and particulate problems. Furthermore, contaminant build up around the resolving aperture 240 (e.g., the upstream facing surface 242 of the resolving plate 236 of FIGS. 4A–4B) further causes desirable ions near the outer extremities of the beam path P' to strike and dislodge the built up contaminants. The dislodged contaminants can further travel to the surface of the workpiece 228, thus potentially causing various undesirable effects on the resulting implanted workpiece.

Therefore, according to another exemplary aspect of the invention, an intentional misdirection of the ion beam 210 can cause the ion beam to strike the contaminant materials on the upstream facing surfaces 242, thus substantially cleaning the components 250. Furthermore, if the resolving plate 236 comprises one or more beveled upstream facing surfaces 242 having one or more contaminants 260 disposed thereon, such as the resolving plate 236 illustrated in FIG. 5, a repeated misdirection (e.g., dithering) of the ion beam 210 can repeatedly heat and cool the surfaces and/or contaminants, by sweeping the ion beam across the upstream facing surfaces. Such a thermal cycling of one or more of the contaminants 260 and component surfaces 242 advantageously provides a thermal mismatch in coefficients of expansion between the contaminants and the surfaces on which they reside. Such a thermal mismatch is believed to substantially cause an intentional flaking of the contaminants from the surfaces. The misdirection of the ion beam 210 preferably is effected by modulating the extraction voltage $V_{Extract}$, thus causing the velocity of the ions to be modulated as the ions are extracted from the ion source 220. Such a modulation of velocity, in accordance with the Lorenz Equation, will tend to alter the path of the ion beam 210 as it passes through the mass analyzer 238, and thus, cause the ion beam to strike the upstream-facing surfaces 242 of the various ion implantation apparatus components 250.

Accordingly, the path P of the ion beam 210 can be purposely misdirected by modulating the extraction voltage $V_{Extract}$ in a repetitive pattern to misdirect the ion beam, thus causing the ion beam to sweep over the various components 250 in order to strike the contaminant materials, wherein the various components are substantially cleaned. The modulation of the extraction voltage $V_{Extract}$ can be further implemented by the controller 128 of FIG. 2. Thus, the modulation of extraction voltage $V_{Extract}$ can be performed a sufficient number of times to effect dislodgement of all contaminants deposited on the surfaces of the contaminated components.

Figure 6:
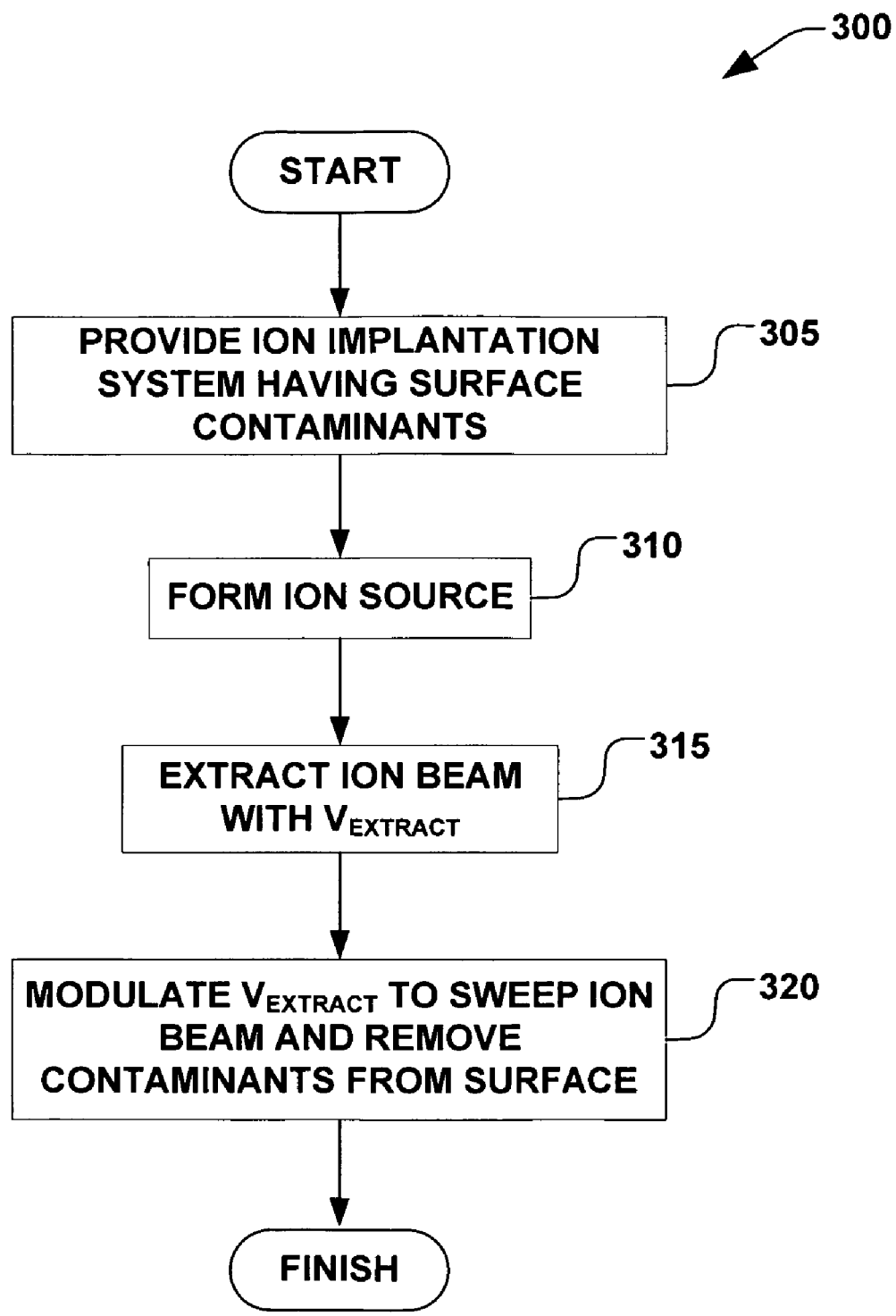
FIG. 6 is a block diagram of an exemplary method for in-situ cleaning of an ion implantation system according to another exemplary aspect of the invention.

Therefore, in accordance with another aspect of the present invention, FIG. 6 illustrates a method 300 for in-situ cleaning of contaminant materials, such as those built up on the upstream facing surface 242 of the resolving plate 236 and other components 250 of the ion implantation apparatus 200 of FIG. 3. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Figure 5:
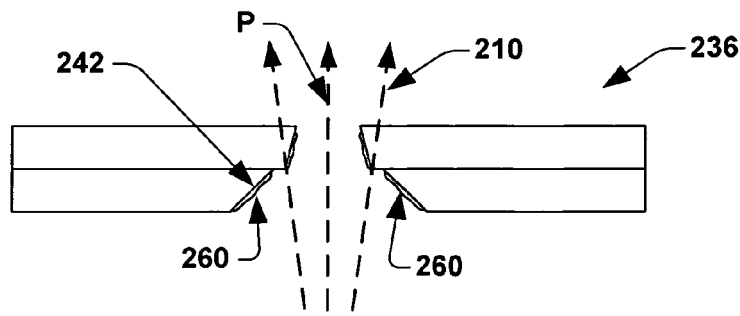
FIG. 5 is an exemplary resolving plate having a resolving aperture, wherein the resolving aperture has one or more contaminants formed thereon according to still another aspect of the present invention.

As illustrated in FIG. 5, the method 300 begins with providing an ion implantation system in act 305, wherein the ion implantation system comprises one or more components having one or more contaminants disposed thereon. For example, the ion implantation system 100 and apparatus 200 of FIGS. 2 and 3 are provided in act 305 of FIG. 5, wherein the resolving plate 236 has one or more contaminants disposed on the upstream facing surface 242 thereof. FIG. 5 further illustrates the exemplary resolving plate 236 having one or more contaminants 260 disposed on the upstream facing surface 242 of the resolving aperture 240. In act 310 of FIG. 5, a process species is provided to the ion implantation system, and an ion source is formed from the process species. For example, a plasma is formed in the ion source 220 of FIG. 3 from a species used for implanting ions into the workpiece 228 by applying a source voltage $V_{source}$ to the species within a plasma chamber (not shown).

In act 315 of FIG. 5, an ion beam is extracted from the ion source by an application of an extraction voltage $V_{Extract}$ to an ion extraction assembly associated with the ion source. For example, the extraction voltage $V_{Extract}$ is applied to the extraction assembly 224 of FIG. 3, wherein ions are extracted from the ion source 220, thus directing the ions through the beamline assembly 214 and toward the end station 216. In accordance with one exemplary aspect of the invention, a nominal extraction voltage $V_{ExtractNom}$ is associated with the path P of the ion beam 210, wherein the path P is associated with the minimum value of dispersion of the ion beam 210, and is further associated with the extraction voltage $V_{Extract}$ applied when implanting ions into the workpiece 228.

Act 320 illustrates a modulation of the extraction voltage $V_{Extract}$, wherein a trajectory of the ion beam is oscillated within a predetermined range about $V_{ExtractNom}$, therein sweeping the ion beam across the one or more components and substantially removing the one or more contaminants therefrom. In one example, the modulation of the extraction voltage $V_{Extract}$ generally provides a cyclical heating of one or more of the contaminants and components, thus providing a differential in thermal coefficients of expansion between the one or more contaminants and components, thus facilitating the removal of the one or more contaminants from the upstream facing surfaces of the components.

According to one example, the nominal extraction voltage $V_{ExtractNom}$ ranges between 0 kV and 80 kV, wherein the extraction voltage $V_{Extract}$ is modulated approximately 6% or less about the nominal extraction voltage $V_{ExtractNom}$, thus providing an efficient sweeping of the ion beam across the one or more components. In another example, the extraction voltage $V_{Extract}$ is modulated at a rate of approximately 1 Hertz or greater, such as between approximately 3 Hz and 10 Hz. Such a modulation generally provides the thermal mismatch between the one or more contaminants and the one or more components to facilitate the flaking off or removal of the contaminants from the upstream facing surfaces of the components.

In accordance with another exemplary aspect of the invention, a barrier is placed in the path of the ion beam at a position generally downstream from the one or more components, wherein the one or more contaminants removed from the one or more components are generally collecting in the barrier. For example, the barrier 239 comprises a flag faraday, as illustrated in FIG. 3, wherein the flag faraday is pivoted into the path P of the ion beam 210 prior to the cleaning of the ion implantation apparatus 200, thus generally preventing the ion beam (and dislodged contaminants—not shown) from entering the end station 216. Once the apparatus 200 has been cleaned, the flag faraday can be pivoted back out of the path P of the ion beam 210, thus facilitating ion implantation into the workpiece 228. Alternatively, the barrier comprises a faraday cup (not shown) associated with the end station 216, wherein the one or more contaminants are generally collected within the faraday cup. The faraday cup, for example, generally resides downstream of the support 229 for the workpiece 228, wherein the cleaning of the ion implantation system can be performed with or without a workpiece positioned in the end station 216.

According to another exemplary aspect of the invention, after the extraction voltage is modulated, one or more workpieces are further implanted with ions via the ion beam formed from the ion source using the same species as used for cleaning the one or more components. For example, a number of workpieces are implanted with ions using the species from the ion source, and the method 300 of FIG. 6 is performed to clean the one or more contaminants from the one or more components of the ion implantation system using the same species for the ion source. After the method 300 is performed, another number of workpieces are then implanted with ions from the ion source. For example, the extraction voltage $V_{Extract}$ is modulated after implanting the ions into a predetermined number of workpieces or after a predetermined amount of time has passed, therein generally defining a cleaning interval. The cleaning interval, for example, may range between approximately 30 seconds and approximately 4 hours. Alternatively, the cleaning interval is associated with a change in a process recipe (e.g., a change in species for the ion source or a change in other parameters associated with the ion implantation system).

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for cleaning an ion implantation system suitable for use in implanting ions into one or more workpieces, the method comprising:
   providing an ion implantation system, wherein the ion implantation system comprises one or more components having one or more contaminants disposed thereon;
   providing a process species to the ion implantation system and forming ions from the process species, therein defining an ion source;
   extracting an ion beam from the ion source via an application of an extraction voltage to an ion extraction assembly associated with the ion source; and
   modulating the extraction voltage, wherein a trajectory of the ion beam is oscillated within a predetermined range, therein sweeping the ion beam across the one or more components and substantially removing the one or more contaminants therefrom.

2. The method of claim 1, wherein sweeping the ion beam comprises cyclically heating one or more of the contaminants and components.

3. The method of claim 1, further comprising:
   placing a barrier in a path of the ion beam downstream from the one or more components; and
   generally collecting the one or more contaminants removed from the one or more components in the barrier.

4. The method of claim 3, wherein the barrier comprises a flag Faraday positioned upstream of an end station associated with the ion implantation system, wherein the one or more contaminants are generally collected within the flag Faraday.

5. The method of claim 1, wherein the one or more components comprise a resolving plate having an aperture through which the ion beam passes, and wherein the aperture generally defines a portion of the ion beam that is exposed to the one or more workpieces.

6. The method of claim 5, wherein the aperture is generally defined by a first surface generally parallel to the ion beam, therein generally defining the portion of the ion beam that is exposed to the one or more workpieces.

7. The method of claim 6, wherein the aperture is further generally defined by an upstream facing surface, wherein the upstream facing surface is generally defined by a second surface obliquely oriented with respect to the ion beam, wherein at least some of the one or more contaminants are disposed on the second surface.

8. The method of claim 7, wherein the upstream facing surface of the aperture is further generally defined by a third surface obliquely oriented with respect to the first and second surfaces, wherein the third surface is closer to being parallel to the first surface than the second surface.

9. The method of claim 7, wherein the upstream facing surface is generally rounded.

10. The method of claim 7, wherein the ion beam is swept across at least the upstream facing surface of the aperture, therein rapidly thermally cycling one or more of the contaminants and aperture, wherein the one or more contaminants are generally dislodged from the aperture.

11. The method of claim 1, wherein the extraction voltage is modulated approximately 6% or less.

12. The method of claim 1, wherein the extraction voltage is modulated at a rate of approximately 1 Hertz or greater.

13. The method of claim 12, wherein the extraction voltage is modulated in a range between approximately 3 Hz and 10 Hz.

14. The method of claim 1, further comprising implanting the ions into the one or more workpieces via the ion beam formed from the process species after the extraction voltage is modulated.

15. The method of claim 14, further comprising modulating the extraction voltage again after implanting the ions into a predetermined number of workpieces or after a predetermined amount of time has passed, therein generally defining a cleaning interval.

16. The method of claim 15, wherein the cleaning interval ranges between approximately 30 seconds and approximately 4 hours.

17. The method of claim 15, wherein the cleaning interval is associated with a change in a process recipe associated with the ion implantation system.

18. The method of claim 1, wherein the process species comprises a gas selected from the group of arsenic, phosphorus, antimony, boron, gallium, and indium.

19. The method of claim 1, wherein the extraction voltage ranges between 0 kV and 80 kV.

* * * * *